United States Patent [19]
Little

[11] Patent Number: 5,663,596
[45] Date of Patent: Sep. 2, 1997

[54] INTEGRATED CIRCUIT SPRING CONTACTS

[75] Inventor: Michael J. Little, Woodland Hills, Calif.

[73] Assignee: Hughes Electronics, Los Angeles, Calif.

[21] Appl. No.: 681,758

[22] Filed: Jul. 29, 1996

Related U.S. Application Data

[62] Division of Ser. No. 577,680, Dec. 21, 1995.

[51] Int. Cl.[6] .......................... H01L 23/48; H01L 39/02
[52] U.S. Cl. ..................... 257/727; 257/696; 257/692; 257/719; 257/726
[58] Field of Search ........................ 257/783, 718, 257/719, 726, 696, 692, 669, 727

[56] References Cited

U.S. PATENT DOCUMENTS

| | | | |
|---|---|---|---|
| 4,203,129 | 5/1980 | Oktay et al. | 257/715 |
| 5,086,337 | 2/1992 | Noro et al. | 257/726 |
| 5,166,774 | 11/1992 | Banerji et al. | 257/668 |
| 5,367,195 | 11/1994 | DiGiacomo et al. | 257/781 |
| 5,375,320 | 12/1994 | Kinsman et al. | 437/220 |
| 5,518,964 | 5/1996 | DiStefano et al. | 437/209 |

*Primary Examiner*—Sara W. Crane
*Assistant Examiner*—Alexander Oscar Williams
*Attorney, Agent, or Firm*—Vijayalakshmi D. Duraiswamy; Wanda K. Denson-Low

[57] ABSTRACT

An integrated-circuit interconnect which can be formed at the wafer level is achieved by depositing an intentionally stressed contact layer over a release layer which is subsequently removed. The removal of the release layer permits a portion of the contact layer to curve away from the surface of an integrated chip. The result is a spring contact having a base portion joined to a member of the chip and a spring portion which is available for joining of other metal members, e.g., on a substrate or another chip. The resilience of the spring portion can also be used to position and align integrated circuit elements.

8 Claims, 6 Drawing Sheets

5,663,596

INTEGRATED CIRCUIT SPRING CONTACTS

This is a division of application Ser. No. 08/577,680 filed Dec. 21, 1995.

BACKGROUND OF INVENTION

1. Field of the Invention

The present invention relates generally to integrated circuits and more particularly to electrical/mechanical contacts for integrated circuits.

2. Description of the Related Art

The cost of integrated circuits is closely related to the number of process steps that are required in their fabrication and assembly. Because process steps performed on a semiconductor wafer are simultaneously completed on a large number of semiconductor dice, integrated circuit cost advantages are realized whenever a process step is transferred to the wafer level. Integrated-circuit chips are typically mounted to substrates with interconnects, e.g., wire bonds, which are not amenable to wafer level processing or with interconnects, e.g., solder bumps, whose rigidity prevents the relief of integrated circuit stresses caused by temperature expansion and contraction. Accordingly, separate interconnect process steps are required on each chip, which generally increase the integrated circuit cost.

SUMMARY OF THE INVENTION

The present invention is directed to an interconnect structure for integrated circuits which can be fabricated at the wafer level. This goal is achieved with the realization that wafer level processes (e.g., photolithographic positioning and metal deposition) can be used to fabricate an intentional stressed metal layer and that a portion of the stressed layer can be allowed to spring upward from the wafer surface by the deposition and subsequent removal of a release layer.

A process which uses this concept includes the steps of depositing a metallic release layer on a semiconductor die proximate to a metal member of the die (e.g an input/output port), and depositing a contact layer over the metal nerobet and the release layer under deposition conditions which induce a predetermined stress in the contact layer. The contact layer is position with a base portion overlying the metal member and a spring portion overlying the release layer. Finally, the release layer is removed to permit the stress to raise the spring portion from the die. A desired contact layer stress can be realized by controlling deposition conditions which include the deposition temperature, the deposition rate and the die temperature.

This process produces a spring contact which has a base portion joined to the metal member and a curved spring portion which extends away from the die surface. After the die is converted to chip form by separation from the wafer, it can be inverted and each spring portion joined, e.g., by soldering, with a corresponding portion of the interconnect pattern of a substrate. Because the spring contacts are formed at the wafer level, the amount of assembly processing is significantly reduced.

In different process and structural embodiments, the deposition process is adapted to induce a tensile stress in the contact layer and a compressive stress in the contact layer. The tensile stress will typically lift an end of the contact layer from the die surface and the compressive stress will typically cause this end of the contact layer to abut the die surface.

In one embodiment, the contact layer includes an chromium adhesion layer which adjoins the metal member and the release layer, a copper conduction layer adjoining the adhesion layer and a gold inert layer adjoining the conduction layer. The release layer is preferably formed from an alloy of tungsten and titanium and is released with a solvent which includes hydrogen peroxide.

Because of the resilience of its spring portion, the spring contact has both electrical and mechanical advantages. Its resilience enhances the reliability of electrical contacts as a chip is being assembled with a substrate. After assembly, its resilience accommodates stresses caused by differential temperature coefficients between the chip and the substrate. The resilience also facilitates use of the spring contact for precise location and alignment of integrated circuits and associated devices, e.g., optoelectronic circuits and optical fibers.

The spring contacts may be positioned at the margins and the interior regions of an integrated circuit die. This freedom in the location of input/output ports simplifies the design of integrated circuits.

The novel feature of the invention are set forth with particularity in the appended claims. The invention will be best understood from the following description when read in conjunction with the accompanying drawings.

DESCRIPTION OF THE PREFERRED EMBODIMENTS

Figure 1:
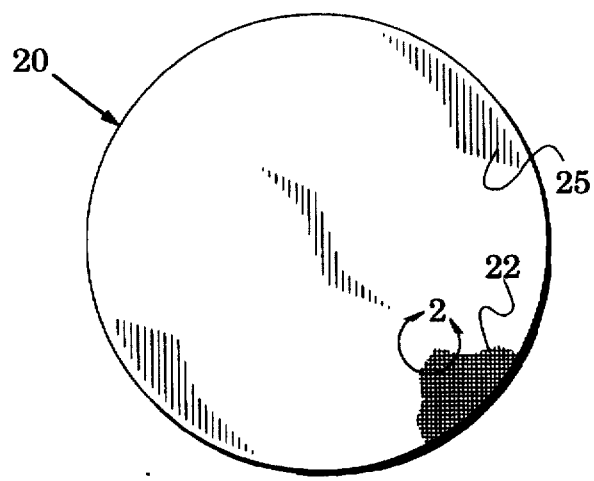
FIG. 1 is a plan view of a semiconductor wafer which includes a plurality of integrated circuit dice.
Figure 2:
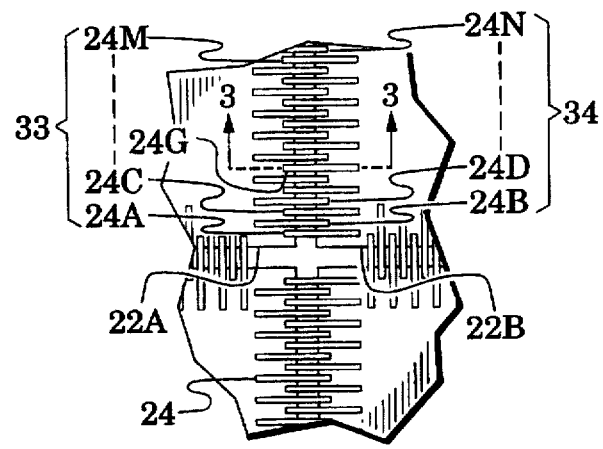
FIG. 2 is an enlarged view of the area within the curved line 2 of FIG. 1, which illustrates a plurality of deposited spring-contact structures in accordance with the present invention.
Figure 3A:
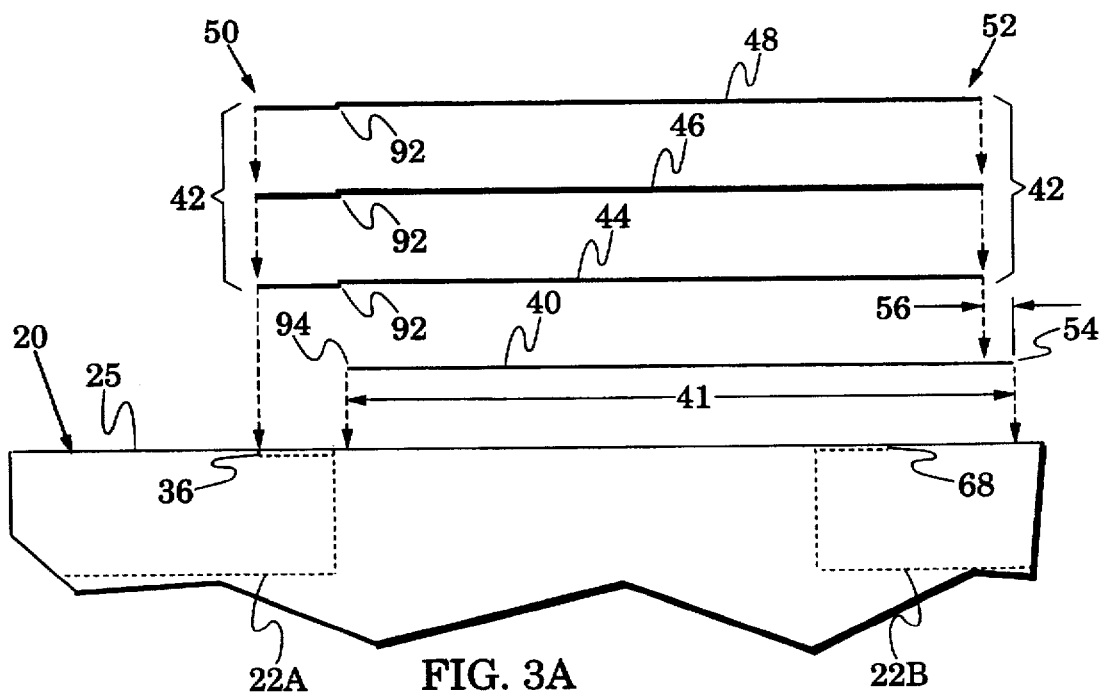
FIG. 3A is an enlarged view along the plane 3—3 of FIG. 2 which illustrates metallization steps that form one of the spring-contact structures of FIG. 2.
Figure 3B:
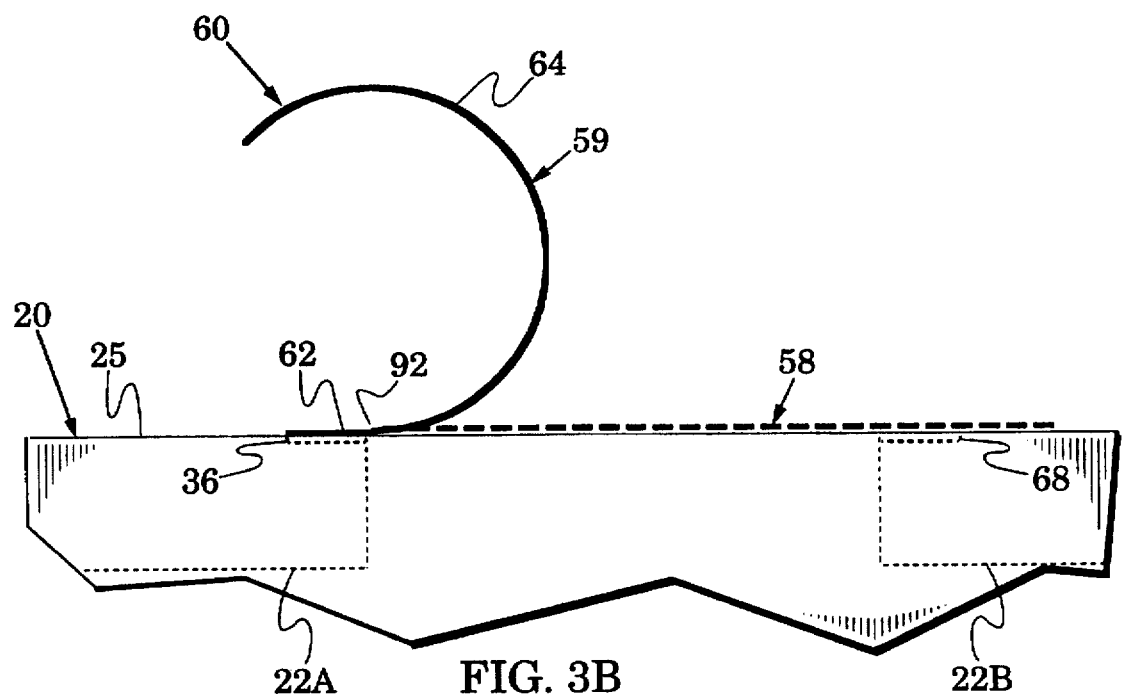
FIG. 3B is a view similar to FIG. 3A which illustrates a spring contact that is former by removal of a release layer in the spring-contact structure of FIG. 3A.
Figure 3C:
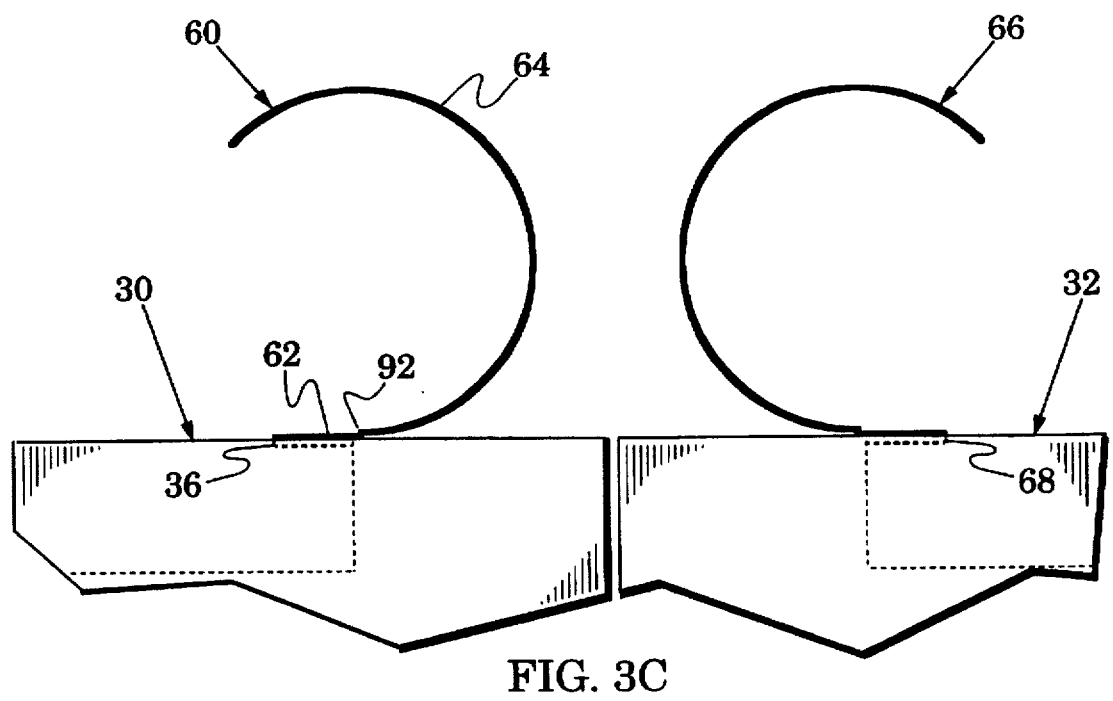
FIG. 3C is a view similar to FIG. 3B which illustrates two chips that have been separated from the wafer of FIG. 1, each of the chips having a spring contact similar to that of FIG. 3B.

FIGS. 1 and 2 illustrate a semiconductor wafer 20 which includes a plurality of dice 22. Each of the dice 22 has an associated set of deposited spring-contact structures 24 on the upper surface 25 of the wafer 20. FIGS. 3A–3C show successive process steps which form the spring-contact structures 24 and which convert each of the dice 22 and its associated set of spring-contact structures 24 into a chip with a set of spring contacts, e.g., the chips 30 and 32 of FIG. 3C.

In particular, the deposited spring-contact structures 24 of FIG. 2 are arranged in set which are positioned in an interdigitated arrangement. For example, the die 22A is associated with a first set 33 which includes the spring-contact structures 24A, 24C,–24M. In a similar manner, the die 22B is associated with a second set 34 which includes the spring-contact structures 24B, 24D,–24N.

In the process steps of FIG. 3A, the diffusion regions of the dice 22A and 22B are indicated by broken lines. Also indicated in broken lines is a metal member in the form of a contact 36 in the upper surface of the die 22A. The contact 36 represents a port (e.g., a signal input, a signal output or a voltage-supply input) of the die 22A. It generally is a metallic member (e.g., an input/output pad) which has been formed by deposition (e.g., sputtering or evaporation) of a metal (e.g., aluminum) or a metal system (e.g., gold and titanium) on the surface of the die 22A. Other typical metal members include portions of capacitor plates, inductors and transmission lines.

In a first step of forming the spring-contact structure 24G of FIG. 2, a release layer 40 is deposited over a region 41 of the surface 25 which is proximate to the contact 36. In subsequent process steps, a contact layer 42 is fabricated from sublayers 44, 46 and 48 so that the contact layer 42 overlies both the contact 36 and the release layer 40. A first end 50 of the contact layer 42 overlie the contact 36 and a second end 52 is preferably spaced from an end 54 of the release layer 40 by a space 56. The space 56 insures that, except for its first end 50, the contact layer 42 is separated from the wafer's upper surface 25 by the release layer 40. The sublayers 44, 46 and 48 are respectively an adhesion sublayer, a conduction sublayer and an inert sublayer.

The metal of the release layer 40 is selected from those metals, e.g., a 90/10 alloy of tungsten and titanium (WTi), which can be easily removed by a dissolving agent, e.g., hydrogen peroxide. The metal of the adhesion sublayer 44 is selected from those metals, e.g., chromium (Cr) and titanium (Ti), which are known to have good adhesive properties to the contact 36. The metal of the conduction sublayer 46 is selected from those metals, e.g., copper (Cu), having low resistivity. Finally, the metal of the inert layer 48 is selected from those metals, e.g., gold (Au), which are stable and resistant to corrosion.

Typically, metal deposition processes leave a residual stress in the deposited metal. In general, this residual stress is a result of a variety of deposition conditions which include a) the deposition technique (e.g., sputtering or evaporation), b) deposition temperature, c) deposition rate, d) die temperature, e) difference in coefficient of thermal expansion between the die and the deposited metal, f) subsequent heat treatment processes, g) type of residual gas in the deposition process and h) pressure of the residual gas.

These conditions are typically controlled with the objective of reducing the residual stress in the deposited metals. However, one feature of the invention is that the deposition process used for the contact layer 42 is intentionally adapted to introduce a stress which would lift the ends 50 and 52 from the wafer's upper surface 25 if the contact layer were not adhered to the wafer 20. By definition, this is a tensile stress in the contact layer 42. In contrast, a compressive stress in the contact layer 42 is a stress (again, by definition) which would lift the central portion (that portion between the ends 50 and 52) of the contact layer 42 from the wafer's upper surface 25 if the contact layer 42 were not adhered to the wafer 20.

Once the deposition process of FIG. 3A has been completed, the release layer 40 is dissolved by application of a solvent. In an embodiment of the deposited spring-contact structure in which the release layer is a WTi alloy, a suitable solvent is a mixture of hydrogen peroxide and water. In the absence of the release layer 40, the tensile stress in the contact layer 42 lifts the end 52 from the wafer's upper surface 25. In response to this stress, the contact layer 42 bends away from its initial position 58 into the curved position 59.

The process as described thus far converts the spring-contact structure 24G into the spring contact 60 of FIG. 3B, which provides an electrical path to the contact 36 of the die 22A. The spring contact 60 has a base portion 62 which is joined to the contact 36 and a spring portion 64 which is available for connection to an external electrical circuit. The base portion 62 is that part of the contact layer 42 which was not initially separated from the wafer surface 25 by the release layer 40.

The same process simultaneously converts the other spring-contact structures of FIG. 2 into spring contacts, e.g., the spring contact 66 of FIG. 3C which provides an electrical path to a contact 68 of the die 22B. With conventional processes (e.g., scoring), the dice 22 of the semiconductor wafer (20 in FIG. 1) can now be separated into chips which each have a set of spring contacts. For example, the dice 22A and 22B are separated into chips 30 and 32 with spring contacts 60 and 66 as shown in FIG. 3C.

Figure 4:
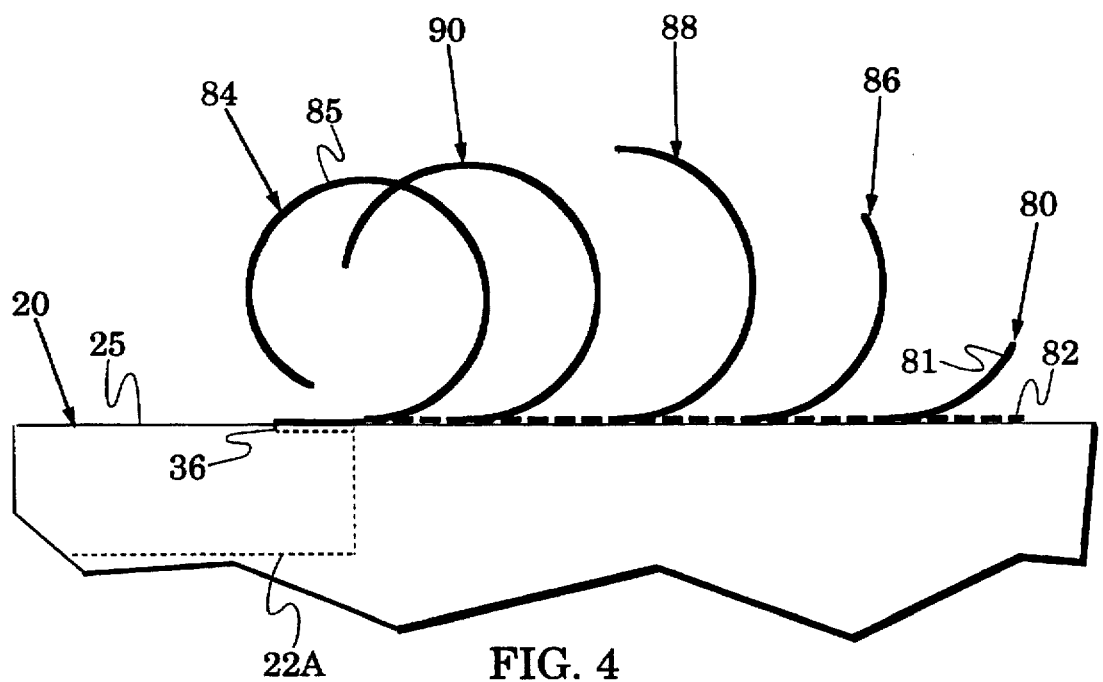
FIG. 4 is a view similar to FIG. 3B, which illustrates other embodiments of the spring contact of FIG. 3B.

FIG. 4 illustrates other embodiments of the spring contact 60 of FIG. 3B. These embodiments are formed by varying the length of the contact layer 42 and the region 41 of FIG. 3A. If the region 41 is relatively short, only a short portion of the end 52 of the contact layer 42 will be released from the substrate surface 25. The resulting spring contact 80 has a short spring portion 81 that flexes upward from an original position 82. In contrast, a spring contact 84 has a long spring portion 85 if the contact layer 42 and the release-layer region 41 are both relatively long. FIG. 4 shows other embodiments 86, 88 and 90 of spring contacts with spring portions which are intermediate in length between the spring portions 81 and 85. The radius of curvature of the spring portions of FIG. 4 can also be varied by adapting he deposition conditions to induce a corresponding degree of stress in the contact layer 42.

Although, the base portion 62 of the spring contact 60 of FIG. 3B was joined to a metal member 36 of the die 20, the base portion can also be joined with other typical die structures, e.g., heavily-doped semiconductor regions.

A step 92 is formed in the contact layer 42 as it is deposited over the release layer 40. The step 92 is exaggerated in FIGS. 3A–3B and 4 for clarity of illustration. In practice, the step is slight because the release layer is generally quit thin, e.g., ~500 angstroms, with respect to the typical thickness of the contact layer 42, e.g., ~1.3 microns. If desired, the deposition process can be adapted, e.g., with conventional etching undercutting techniques, to taper the end 94 of the release layer 40. This process reduces the abruptness of the step 92.

The deposition of the contact layer 42 and release layer 40 may be carried out by conventional methods. An exemplary method in silicon-based systems is the etch masking process. In this process, a metal is deposited on the wafer surface (25 in FIG. 1), a resist is positioned over the metal, the resist is exposed and developed into a pattern and the metal exposed by the pattern is etched away. In the etch masking process, the metal is preferably deposited by sputtering because this deposition process provides a more consistent layer on nonplanar surfaces (e.g., the step 92 in FIG. 3A).

An exemplary method for semiconductor systems, e.g., gallium arsenide, which are attacked by typical metal etchants is the lift-off process. In this process, resist is applied to the wafer surface and then exposed and developed to form a pattern. After metal is deposited over the wafer, the resist is dissolved by a solvent. This "lifts off" the metal which was on the resist but not the metal on the wafer surface. In contrast with sputtering, evaporated metal strikes a wafer surface primarily from one direction. Accordingly, metals are preferably deposited by evaporation in the lift-off process because this obtains a better separation between the portion deposited on the resist and the portion deposited on the wafer surface.

Figure 5:
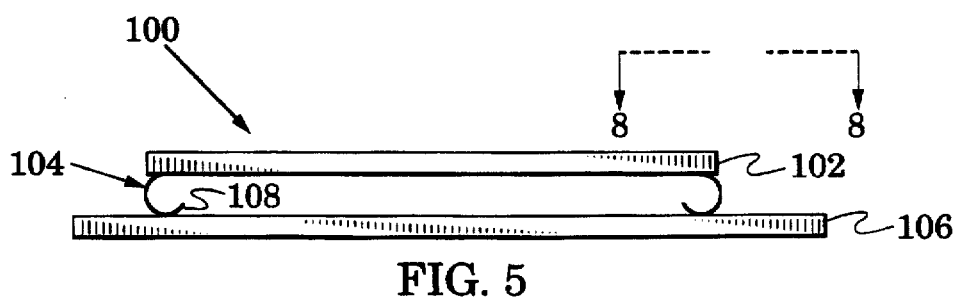
FIG. 5 is a side elevation view of an assembly application of the spring contact of FIG. 3B.

FIG. 5 illustrates an exemplary application 100 of the spring contact 60 of FIG. 3C. In this application, an integrated circuit chip 102 is fabricated with a plurality of spring contacts 104 which are similar to the spring contact 60 of FIG. 3C. A substrate 106 carries a pattern of interconnect metallization and the spring contacts 104 are positioned so that the spring portion 108 of each contact 104 can be joined, e.g., by soldering, to a respective portion of the substrate's interconnect pattern.

Figure 6A:
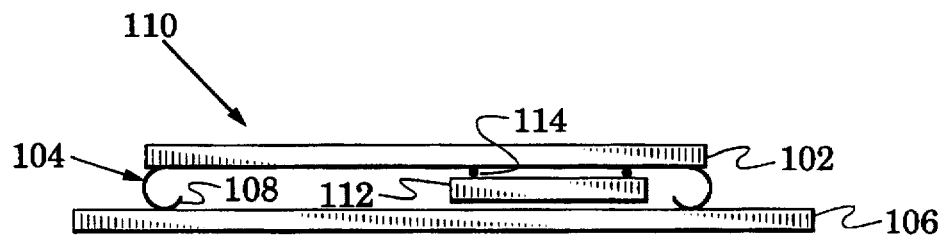
FIG. 6A is a side elevation view of another assembly application of the spring contact of FIG. 3B.

FIG. 6A illustrates another exemplary application 110 of the spring contact 60 of FIG. 3C FIG. 6A is similar to FIG. 5 with like elements indicated by like reference numbers. In this application, a second integrated circuit chip 112 has been inverted and connected to the integrated-circuit chip 102 with a conventional process such as the "flip-chip bonding" process in which solder bumps 114 mechanically and electrically interconnect the chips 102 and 112.

Figure 6B:
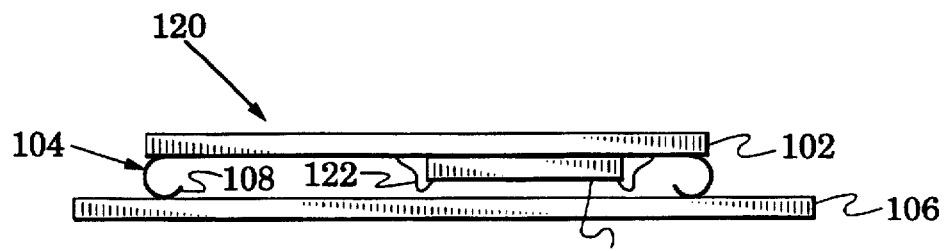
FIG. 6B is a sidle elevation view of another assembly application of the spring contact of FIG. 3B.

FIG. 6B shows another application 120 which is similar to the application 110 of FIG. 6A with like elements indicated by like reference numbers. In the application 120, the integrated circuit chips 112 abuts the integrated circuit chip 102 and interconnects are realized with conventional wire bonds 122.

The cost of an integrated-circuit chip increases with each fabrication and assembly process step that is performed on that chip. Those process steps, e.g., masking and metallization, which can be performed on the wafer 20 of FIG. 1, i.e., at the wafer stage, are completed simultaneously for each of a large number, e.g., a thousand, of dice 22. Accordingly, integrated circuit costs are reduced when a process step can be transferred to wafer-level processing. The assembly processes exemplified by FIGS. 5, 6A and 6B represent significant cost savings because the spring contacts 104 are fabricated at the wafer level.

Figure 7:
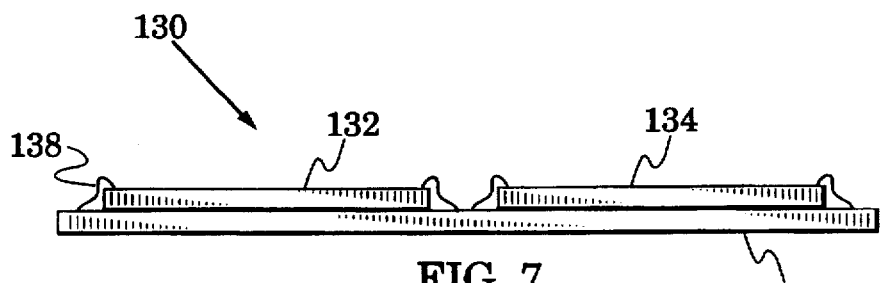
FIG. 7 is a side elevation view of a conventional assembly process which can be replaced by the processes of FIGS. 5 and 6.

For comparison, FIG. 7 illustrates a conventional assembly 130 in which integrated circuits 132 and 134 are interconnected to a common substrate 136 with wirebonds 188. Many conventional interconnects, e.g., wire bonds, are not fabricated at the wafer level because their structure is not easily adapted to integrated-circuit photolithographic and deposition processes. Consequently, each of these interconnects 138 must be separately added during the assembly stage that produces the assembly 130. These additional process steps are eliminated by the spring contact 60 of FIG. 3B.

The present invention is particularly suited for situations in which an electronic system must be partitioned among a plurality of integrated circuits which are then mounted on a common substrate. For example, many systems (e.g., an accelerometer-based, control-loop system) include micromachined modules (MEMs) and associated electronic circuits. MEMs typically share many of the basic processes, e.g., photolithographic pattern definition, masking and etching, that are conventionally used in electronic chips. However, the processes have differences (e.g., the degree of etching in an MEM is typically deeper and more extensive than the same process in an electronic chip), which generally cause MEMs and their associated electronics to be fabricated on separate wafers.

Consequently, they are usually combined on a substrate as exemplified by FIG. 7. With the teachings of the present invention, an MEM chip 112 and an associated electronics chip 102 could be combined as shown in FIGS. 6A and 6B in which the spring contacts 104 have already been fabricated at the wafer level of the chip 102.

Figure 8:
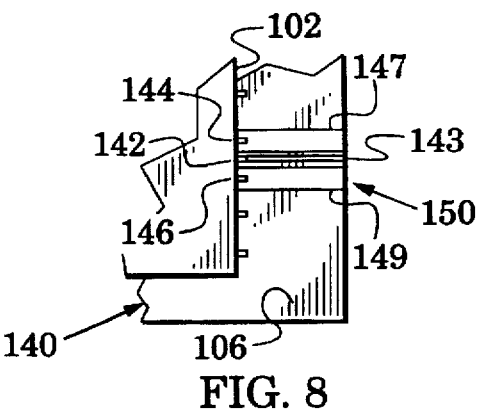
FIG. 8 is a view along the plane 8—8 of FIG. 5 which illustrates connections between sp contacts and a coplanar transmission line in the assembly of FIG. 5.

FIG. 8 is a view along the plane 8—8 of FIG. 5 which illustrates another application 140 for the spring contact 60 of FIG. 3C. In this figure a first one 142 of the spring contacts 104 of FIG. 5 connects, e.g., by soldering, to a microwave signal line 143 on the substrate 106. Second and third ones 144 and 146 of the spring contacts 104 connect respectively to microwave ground planes 147 and 149 on the substrate 106. The signal line 143 and the ground planes 147 and 149 form a conventional coplanar microwave transmission line 150. The width and spacing of the spring contacts 142, 144 and 146 can be adjusted to obtain a microwave impedance which is compatible with the characteristic impedance of the transmission line 150. FIG. 8 illustrates the simplicity of forming a microwave connection with spring contacts of the present invention.

Figure 9:
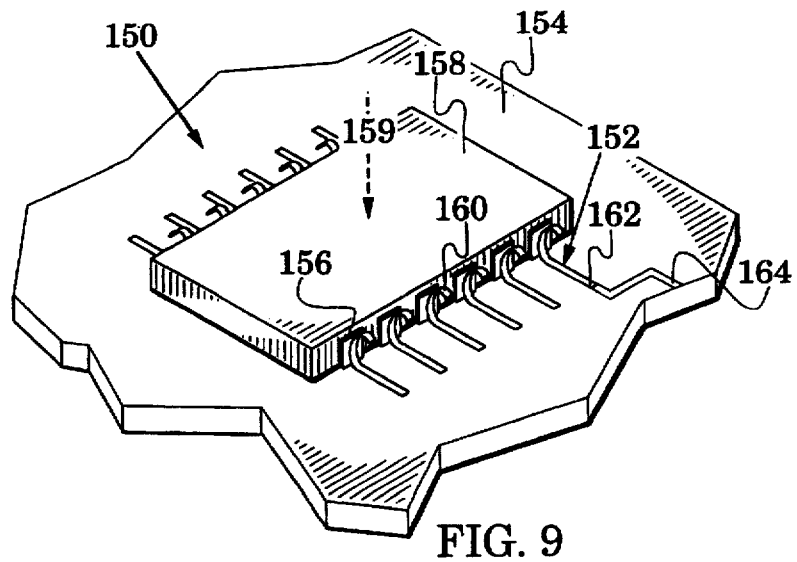
FIGS. 9 and 10 are perspective views of other assembly applications of the spring contact of FIG. 3B.

Another application 150 for the spring contact 60 of FIG. 3C is shown in FIG. 9. In this application a plurality of spring contacts 152 are fabricated on a substrate 154. Each of the spring contacts 152 is positioned to contact a respective one of a plurality of external contacts 156 on an integrated circuit 158. The integrated circuit 158 is installed by pressing it (indicated by the broken action arrow 159) into the yielding resistance of the spring portions 160 of the spring contacts 152. The integrated circuit 158 can be removed by extracting it from the restoring forces of the spring portions 160. Alternatively, the installation can be made more permanent by joining, e.g., by soldering, the spring portions 160 to their respective contacts 156. In this application, the spring portion 160 of each spring contact is connected an integrated circuit contact 156 and the base portion 162 of each spring contact 152 is connected to a metal member, e.g., the circuit line 164, on the substrate 154.

The application 150 illustrates the use of the electrical and mechanical properties of the spring contact 60 of FIG. 3B. For example, not all of the spring contacts 152 of FIG. 9 necessarily complete an electrical connection. Even if one or more of the integrated circuit contacts 156 is unused, the restoring force of its respective spring portion 160 aids in retaining the integrated circuit 158 in place on the substrate 154.

Figure 10:
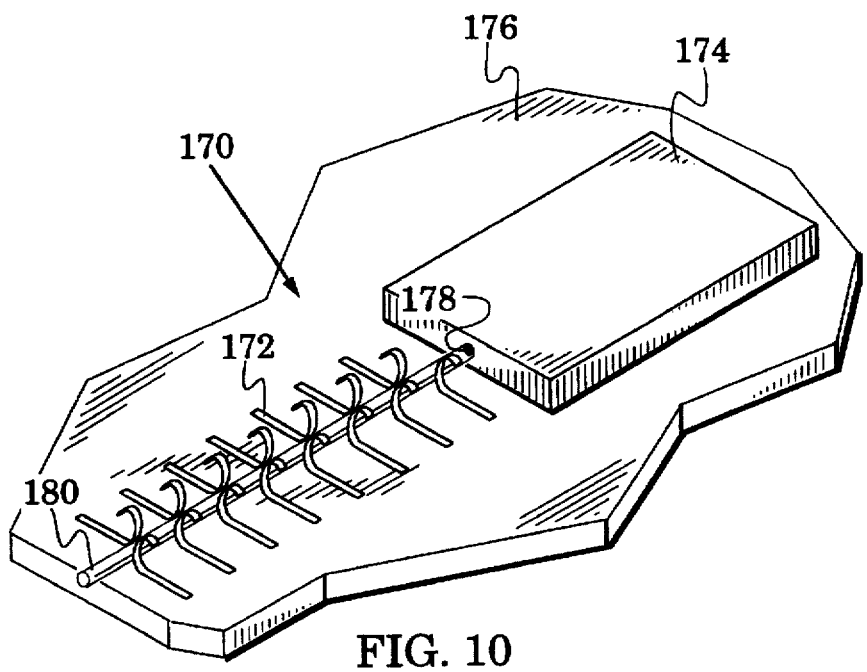

Thus, the spring contact 60 of FIG. 3B may be used in applications which utilize its electrical advantages, its mechanical advantages or both. An application 170 shown in FIG. 10, in which the mechanical advantages are of primary importance. An optoelectronic module 174, e.g., a semiconductor laser, is mounted on a substrate 176. The optoelectronic module 174 has an optical port 178 which is to be aligned with an optical fiber 180. A plurality of spring contacts 172 are positioned to receive the optical fiber 180 (it can be pressed downward into the contacts) and align it with the optical port 178. To avoid excessive transmission losses, any misalignment of optical fibers and optical ports of optoelectronic modules must be held within very small limits, e.g., ~1-2 microns. Because the spring contacts 172 can be fabricated with conventional photolithographic techniques, their positioning on the substrate 176 can be compatible with these limits.

Figure 11:
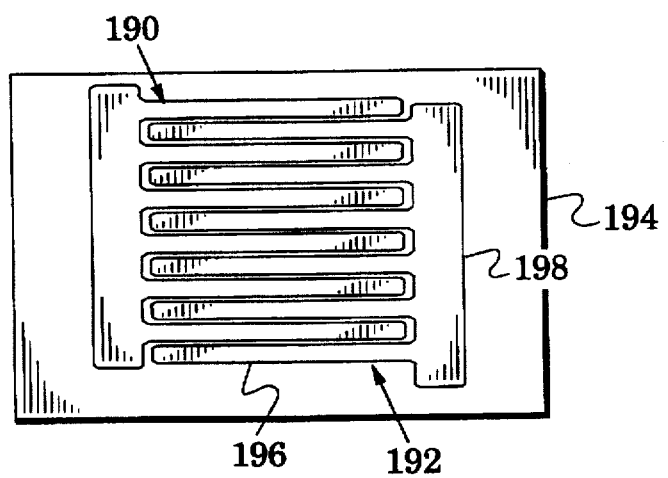
FIG. 11 is a plan view of a pair of deposited spring-contact structures in accordance with the present invention.

Another application of mechanical properties is shown in FIG. 11, which illustrates a pair of spring-contact structures 190 and 192 that have been deposited on a substrate 194. Each of the structures has a plurality of spring portions 196 which extend from a base portion 197 and which have been formed with a tensile stress. The spring portions 196 extend over a release layer similar to the layer 40 of FIG. 3. The spring portions 196 of the two interconnect structures 190 and 192 are positioned in an interdigitated arrangement.

Figure 12:
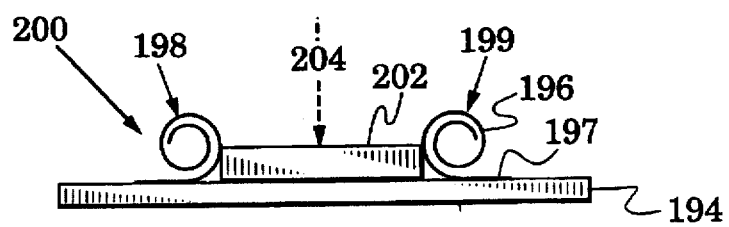
FIG. 12 is an end elevation view of an assembly application of the spring-contact structures of FIG. 11.

When the release layer is removed, the spring portions 196 curl into the shape shown in end view of FIG. 12. The structures 190 and 192 now form spring contacts 198 and 199. In an assembly 200, a module 202 (e.g., an optoelectronic module) can be inserted, as indicated by the broken action line 204, between the spring portions 196 and held in place by their restoring force. Because the spring structures 190 and 192 of FIG. 11 can be defined by photolithographic techniques, the assembly 200 is capable of positioning the module 202 with great accuracy. The cross-sectional dimensions and the metals of the contact layer 42 of FIG. 3 can be selected to obtain a predetermined spring constant in the spring portions 196.

Each of the spring-contact structures 24 of FIG. 2 has an end (52 in FIG. 3A) which will curl upwards from the wafer surface (25 in FIG. 1) when a release layer (40 in FIG. 3A) is removed. In FIG. 2, the spring-contact structures 24 are positioned so that the ends 52 of the spring-contact structures of one die, e.g., the die 22A, overlap an adjacent die, e.g., the die 22B.

Figure 13:
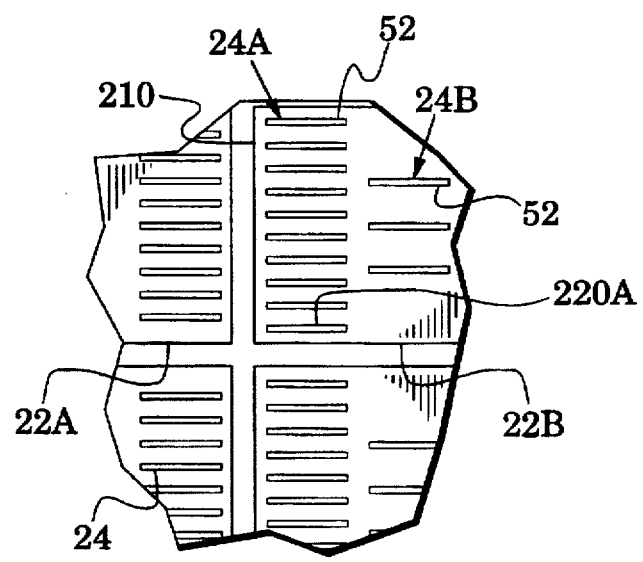
FIG. 13 is a view similar to FIG. 2 which illustrates another arrangement of a plurality of deposited spring-contact structures.

Many other arrangements of the deposited spring-contact structures 24 are easily envisioned. FIG. 13 is a view similar to FIG. 2 with like elements indicated by like reference numbers. In this figure, the spring-contact structures 24 are positioned to lie over their associated die, i.e., they do not extend over an adjacent die. For example, the spring-contact structure 24A is deposited with its end 52 directed away from the margin 210 of the die 22B rather than across this margin as in FIG. 2. When the release layer (40 in FIG. 3) is removed, the end 52 will curl up from the substrate surface (25 in FIG. 1).

FIG. 13 also illustrates that spring-contact structures need not be positioned only adjacent a die's margin. For example, the spring-contact structure 24B is positioned in the center region of die 24B where it is spaced behind other spring-contact structures adjacent the die's margin 210. When the release layer (40 in FIG. 3) is removed, the end 52 of the spring-contact structure 24B will curl away from the substrate surface (25 in FIG. 1).

The structure of FIG. 13 permits the removal of the release layer (40 in FIG. 3) to be delayed until after the dice 22 of FIG. 1 have been diced from the wafer 20. This provides a measure of protection to the spring-contact structures 24 during the dicing operation. The structure of FIG. 13 also illustrates the freedom of location which is facilitated by the design of the spring-contact structures 24. In the structure of FIG. 13, the dice, e.g., 22A and 22B, are independent, i.e., their designs do not overlap, so that their design is simplified.

FIG. 3A illustrates a process for depositing a contact layer 42 in which the process is intentionally adapted to introduce a stress into the contact layer. As state above, this process could by adapted to induce a tensile stress or a compressive stress in the contact layer 42. When the release layer 40 is removed, tensile stress will lift the end 52 from the wafer's surface 25 as shown in FIG. 3B. That is, FIG. 3B illustrates a spring contact 60 that is formed by removal of a release layer 40 in the spring-contact structure of FIG. 3A.

Figure 14:
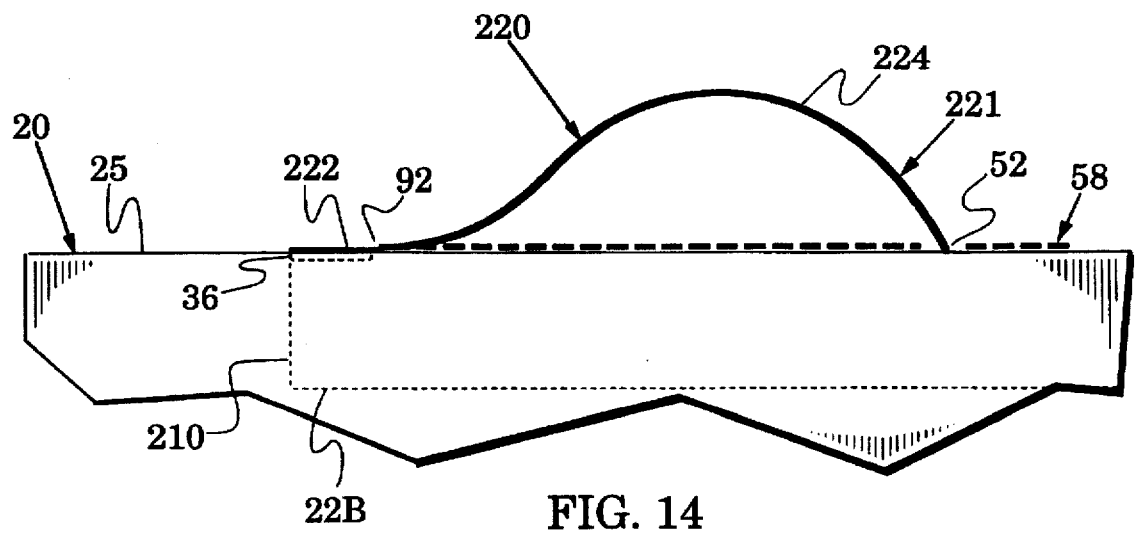
FIG. 14 is a view similar to FIG. 3B which illustrates another spring contact that is formed by removal of a release layer in the spring-contact structure of FIG. 3A.

FIG. 14 is a view similar to FIG. 3B, which illustrates another spring contact 220 that can be formed by removal of a release layer 40 in the spring-contact structure of FIG. 3A. The spring contact 220 is obtained when compressive stress is formed in the contact layer 42. The compressive stress lift the central portion of the contact layer 42 from the wafer's upper surface 25. The contact layer bends away from its initial position 58 (shown in broken lines) into the curved position 221. In FIG. 14, the contact layer was deposited as shown for the spring contact structure 220A of FIG. 13, i.e., it is directed inward from the margin 210 of the die 22B.

The spring contact 220 has a base portion 222 which is joined to a contact 36 of the die 22B. It also has a spring portion 224 which is spaced from the surface of the die 22B and is therefore available for connection to an external electrical circuit. The compressive stress will typically cause the end 52 to abut the surface of the die. The base portion 222 is that part of the contact layer (42 in FIG. 3A) which was not initially separated from the wafer surface 25 by the release layer (40 in FIG. 3A). The spring portion 224 is that portion of the spring contact 220 between its base portion 222 and its free end 52.

In either of the spring contact embodiments 60 and 220, the removal of a release layer allows stress in the layer to raise a spring portion (64 or 224) from the surface of a die. The spring portion is then in position to provide a circuit path to the base portion (62 or 222) of the spring contact. Similar to the spring contact 60 of FIG. 3B, the spring contact 220 can be used in a variety of applications. For example, the spring contacts 104 of FIGS. 5, 6A and 6B can each be replaced by the spring contact 220. In this replacement, the spring portion 224 of FIG. 14 would abut the substrate 106.

As described previously, the spring portion 59 of FIG. 3B assumes its curved position 59 because of tensile stress in the contact layer 42 of FIG. 3A. The tensile stress was induced by deposition conditions during fabrication of the contact layer. This stress can result from a predetermined tensile stress that was induced in the inert layer 48 with the other layers being substantially free of stress. Alternatively, this stress can result from a predetermined compressive stress that was induced in the adhesion layer 44 with the other layers being substantially free of stress. Again, this stress can result from a predetermined compressive stress that was induced in the thick conduction layer 46 with the other layers being substantially free of stress.

These stress conditions are essentially reversed in the spring contact 220 of FIG. 14. The spring contact 220 assumes its curved position 221 because of compressive stress in the contact layer 42 of FIG. 3A. This stress can result from a predetermined compressive stress that was induced in the inert layer 48 with the other layers being substantially free of stress. Alternatively, this stress can result from a predetermined tensile stress that was induced in the adhesion layer 44 with the other layers being substantially free of stress. Again, this stress can result from a predetermined tensile stress that was induced in the thick conduction layer 46 with the other layers being substantially free of stress.

In an exemplary deposition process, a predetermined tensile or compressive stress is obtained by adapting the deposition conditions. The conduction layer 46 of FIG. 3A can be fabricated by evaporation and a selected stress induced by varying its deposition rate. The deposition rate has an effect upon the time each deposited atom has to find its resting place in the deposited layer and the variation of resting places induces a stress into the layer. For example, if the deposition rate is increased from 5 angstroms/second to 20 angstroms/second during the deposition of the conduction layer 46, a tensile stress will be induced in this layer.

In another exemplary deposition process, a desired stress is obtained by controlling the wafer temperature. Changes in temperature also affect the time each deposited atom has to find its resting place in the deposited layer. Accordingly, compressive and tensile stresses can be realized by proper selection of deposition temperatures.

A desired stress can also be obtained by proper selection of stresses in adjacent layers. For example, if the thin inert layer 48 has a compressive stress and the thicker conduction layer 46 has a tensile stress, the contact layer 42 will have a tensile stress, i.e., the thicker layer will dominate.

In an exemplary prototype design of the spring contact 60 of FIG. 3C, the release layer 40 is formed from a 90/10 alloy of WTi in a thickness of ~500 angstroms, the adhesion layer 44 is formed of Cr in a thickness of ~2000 angstroms, the conduction layer 46 is formed of Cu in a thickness of ~1 micron and the inert layer 48 is formed of Au in a thickness of ~1000 angstroms. The length of the contact layer 44 is 600 microns. Hydrogen peroxide is a particularly suitable solvent in this embodiment because it is relatively innocuous in an integrated circuit environment.

Other process embodiments may utilize other release materials and solvents. For example, an organic solvent can remove a release layer of photoresist. Other contact layer 42 embodiments can be formed with other combinations of metals. For example, the adhesion layer 44 can be of Ti and the conduction layer 46 can be of Al or silver (Ag). The contact layer 42 may also be formed with a different number of sublayers. For example, a layer combination of Cu, Au, indium and tantalum. Preferably, Au layers are positioned for interface purposes rather than for adhesion purposes.

Although sputtering and evaporation deposition of metals are particularly suitable processes for practicing the teachings of the invention, other process embodiments, e.g., plating, may be employed.

The metal systems described above are primarily intended for use in silicon-based semiconductor systems but the teachings of the invention are also applicable to other semiconductor systems, e.g., gallium arsenide and indium phosphide.

In a first feature of the spring contacts spring contacts 60 and 220 of FIGS. 3B and 14, they may be positioned at the margins and the interior regions of an integrated circuit die as shown in FIG. 13. This freedom in the location of input/output ports further simplifies the design of integrated circuits. In a second feature of the spring contacts, their resilience accommodates thermal expansion stresses caused by differential temperature coefficient s between a chip and a substrate (as in FIG. 5).

In contrast, both of these features are generally not possessed by conventional interconnect structures. For example, wire bonds (122 in FIG. 6B) exhibit resilience but can only be positioned at the margin of integrated circuit chips. As a second example, solder bumps (114 in FIG. 6A) can be positioned at the margins and the interior regions of an integrated circuit chip but they are essentially rigid so that they do not accommodate differential thermal expansions.

The compliance feature of the spring portions 64 and 224 of the spring contacts 60 and 220 of FIGS. 3B and 14 further enhances their use in assemblies such as the assembly 100 of FIG. 5. A slight downward pressure on the chip 104 against the yielding resistance of the spring portions ensures that each spring portion is in contact with its respective metal member in the substrate 106.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:
1. A semiconductor chip assembly, comprising:
   a semiconductor chip having a surface; and
   at least one spring contact formed from a metallic member which has a base portion and a spring portion that has a curved configuration;
   said metallic member having a length and metallic layers throughout said length that include a conduction layer adjoining and positioned between an adhesion layer and an inert layer with said layers having a combined thickness of approximately 1.3 microns;
   wherein:
   said conduction layer is formed of a metal selected from a group of copper, aluminum and silver;
   said adhesion layer is formed of a metal selected from a group of chromium and titanium;
   said inert layer is formed of gold; and
   said base portion joined to said surface with said adhesion layer adjoining said surface and said spring portion curving away from said surface;
   said spring portion assuming said curved configuration to reduce stress between said conduction layer, said adhesion layer and said inert layer.
2. A substrate assembly, comprising:
   a substrate; and
   at least one spring contact formed from a metallic member which has a base portion and a spring portion that has a curved configuration;
   said metallic member having a length and metallic layers throughout said length that include a conduction layer adjoining and positioned between an adhesion layer and an inert layer with said layers having a combined thickness of approximately 1.3 microns;
   wherein:
   said conduction layer is formed of a metal selected from a group of copper, aluminum and silver;
   said adhesion layer is formed of a metal selected from a group of chromium and titanium;
   said inert layer is formed of gold; and
   said base portion is joined to said substrate with said adhesion layer adjoining said surface and said spring portion curving away from said substrate;

said spring portion assuming said curved configuration to reduce stress between said conduction layer, said adhesion layer and said inert layer.

3. An integrated circuit assembly, comprising:

a substrate having a surface;

a semiconductor chip having a surface; and a plurality of spring contacts wherein each of said spring contacts is formed from a metallic member which has a base portion and a spring portion that has a curved configuration and:
  a) said metallic member has a length and metallic layers throughout said length that include a conduction layer adjoining and positioned between an adhesion layer and an inert layer with said layers having a combined thickness of approximately 1.3 microns;
  b) said conduction layer is formed of a metal selected from a group of copper, aluminum and silver;
  c) said adhesion layer is formed of a metal selected from a group chromium and titanium; and
  d) said inert layer is formed of gold;

and wherein:

each of said base portions is joined to a different region of the surface of a selected one of said substrate and said chip with said adhesion layer adjoining said surface;

each of said spring portions curves away from said selected one of said substrate and said chip; and said spring portions each abut a different region of the other of said substrate and said chip;

said spring portion of each of said spring contacts assuming said curved configuration to reduce stress between its conduction layer, its adhesion layer and its inert layer.

4. An integrated circuit assembly, comprising:

a first semiconductor chip having a surface;

a second semiconductor chip having a surface; and a plurality of spring contacts wherein each of said spring contacts is formed from a metallic member which has a base portion and a spring portion that has a curved configuration and:
  a) said metallic member has a length and metallic layers throughout said length that include a conduction layer adjoining and positioned between an adhesion layer and an inert layer with said layers having a combined thickness of approximately 1.3 microns;
  b) said conduction layer is formed of a metal selected from a group of copper, aluminum and silver;
  c) said adhesion layer is formed of a metal selected from a group of chromium and titanium; and
  d) said inert layer is formed of gold;

and wherein:

each of said base portions is joined to a different region of the surface of a selected one of said first and second semiconductor chips with said adhesion layer adjoining said surface;

each of said spring portions curves away from said selected one of said first and second semiconductor chips; and said spring portions each abut a different region of the other of said first and second semiconductor chips;

said spring portion of each of said spring contacts assuming said curved configuration to reduce stress between its conduction layer, its adhesion layer and its inert layer.

5. The semiconductor chip assembly of claim 1, wherein said length of said metallic member is approximately 600 microns.

6. The substrate assembly of claim 2, wherein said length of said metallic member is approximately 600 microns.

7. The integrated circuit assembly of claim 3, wherein said length of said metallic member is approximately 600 microns.

8. The integrated circuit assembly of claim 4, wherein said length of said metallic member approximately 600 microns.

* * * * *